United States Patent [19]

Sobajima et al.

[11] 3,886,380

[45] May 27, 1975

[54] GAIN CONTROL CIRCUIT

[75] Inventors: Norio Sobajima; Kenichi Tonomura, both of Tokyo, Japan

[73] Assignee: Hitachi, Ltd., Japan

[22] Filed: Jan. 11, 1974

[21] Appl. No.: 432,518

[30] Foreign Application Priority Data

Jan. 12, 1973 Japan .................................. 48-5959

[52] U.S. Cl. ................ 307/237; 307/235; 330/30 D

[51] Int. Cl. ........................................... H03k 17/00

[58] Field of Search ............ 330/30 D, 69; 307/237, 307/254, 235

[56] References Cited

UNITED STATES PATENTS 3,573,491 4/1971 Goss et al. ......................... 330/69 X 3,746,892 7/1973 Ogiso et al. ......................... 330/30 D 3,781,699 12/1973 Sakamoto ......................... 330/30 D

*Primary Examiner*—Michael J. Lynch

*Assistant Examiner*—B. P. Davis

*Attorney, Agent, or Firm*—Craig & Antonelli

[57] ABSTRACT

A gain control circuit employs a differential amplifier, and is characterized in that a control voltage having a non-linear characteristic with respect to the resistance of a variable resistor is supplied to the differential amplifier, whereby the gain is efficiently controlled over a wide control range.

8 Claims, 4 Drawing Figures

GAIN CONTROL CIRCUIT

BACKGROUND OF THE INVENTION

1. Field of the Invention

The present invention relates to gain control circuits and, more particularly, to a gain control circuit employing a differential amplifier.

2. Description of the Prior Art

FIG. 1 shows an example of a prior art gain control circuit. Referring to the figure, the gain control circuit has N-P-N transistors $T_1$ and $T_2$ which are emitter-coupled and which constitute a differential amplifier stage. The respective emitters are grounded through a signal source S as well as a current source $I_0$. The collector of the transistor $T_1$ is directly connected to a power source $V_{CC1}$, while the collector of the transistor $T_2$ is connected through a resistance $R_1$ to the power source $V_{CC1}$. A constant voltage source $V_B$ is connected to the base of the transistor $T_2$, and the varying terminal of a variable resistor $R_X$ is connected to the base of the transistor $T_1$. One end of the variable resistor $R_X$ is grounded, while the other end is connected to a power source $V_{CC2}$.

With such a construction, when the varying terminal of the variable resistor $R_X$ is manipulated, the base voltage $V_A$ of the transistor $T_1$ changes. The ratio of currents flowing through the respective transistors $T_1$ and $T_2$ changes with this change. Accordingly, the manipulation of the variable resistor $R_X$ changes the gain of the transistor $T_2$, to change an output voltage which appears at output terminal OUT connected to the collector of the transistor $T_2$.

In this case, coil gain control circuit exhibits the control characteristic illustrated in FIG. 2 on the basis of the differential amplification function of the transistors $T_1$ and $T_2$. In the FIGURE, the abscissa represents the difference ($V_A$ - $V_B$) between the base voltages of the transistors $T_1$ and $T_2$, while the ordinate represents the collector currents $I_{C1}$ and $I_{C2}$ of the respective transistors $T_1$ and $T_2$. As is seen from FIG. 2, the gain control circuit changes the gain only within a certain range of the difference ($V_A$ - $V_B$) of the base voltages. Also, the base voltage difference ($V_A$ - $V_B$) at which the gain changes lies within approximately $\pm 0.1$ V.

In order to control the gain in such a narrowly confined range of the base voltage difference, the value of the variable resistor $R_X$ must be determined taking into consideration the dispersions of the constituent parts of the circuit.

In the use of the gain control circuit as, for example, a volume control circuit, when the value of the variable resistor $R_X$ is very small, it is sometimes impossible to achieve the necessary base voltage difference. On the other hand, even when the resistance of the variable resistor $R_X$ is minimized, signals sometimes leak to the output end OUT. When the value of the variable resistor is made large in order to solve such problems, gain control is effected in a range of low resistances. In a range of high resistances, however, the collector current of the transistor $T_2$ is saturated, and the signal appearing at the output end OUT changes only slightly. Since the sound volume is controlled in the small range of the resistances of the variable resistor, it changes considerably even for a slight movement of the varying terminal. Fine adjustment of the sound volume is therefore difficult for the manipulator.

SUMMARY OF THE INVENTION

It is, accordingly, a principal object of the present invention to provide a gain control circuit which can satisfactorily control the gain.

Another object of the present invention is to provide a gain control circuit having wide gain controlling range which can effect gain control by exploiting the minimum to maximum resistances to a variable resistor.

A further object of the present invention is to provide a gain control circuit which facilitates fine adjustment by a manipulator.

Still a further object of the present invention is to provide a gain control circuit in which, when the resistance of a variable resistor is minimized, no signal appears at its output.

A further object of the present invention is to provide a gain control circuit which is suitable for use in a semiconductor integrated circuit.

In order to accomplish such objects, the present invention employs a curved characteristic relative to the changes of the resistance of a variable resistor imparted to the output voltage of a control bias circuit including the variable resistor.

BRIEF DESCRIPTION OF THE DRAWINGS

FIG. 1 is a circuit diagram showing an example of a prior art gain control circuit, the diagram having been already referred to;

FIG. 2 is a diagram for explaining the operation of the circuit in FIG. 1, the diagram having also been referred to;

PREFERRED EMBODIMENT OF THE INVENTION

Figure 1:
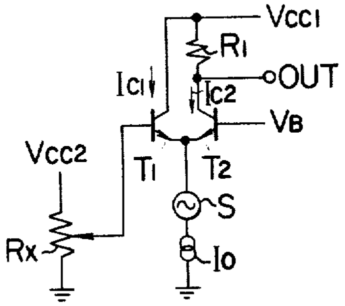
FIG. 1 PRIOR ART
Figure 2:
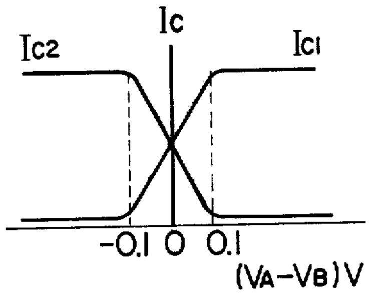
FIG. 2 PRIOR ART
Figure 3:
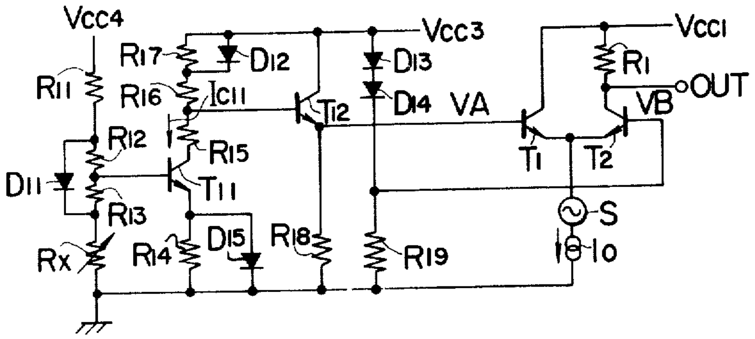
FIG. 3 is a circuit diagram showing an embodiment of the gain control circuit according to the present invention.

FIG. 3 shows an embodiment of the gain control circuit according to the present invention, in which the same parts as in FIG. 1 are denoted by the same symbols. In the circuit diagram, $T_{11}$ and $T_{12}$ designate N-P-N transistors, $D_{11}$ - $D_{15}$ diodes, $R_{11}$ - $R_{19}$ resistances, and $V_{CC3}$ and $V_{CC4}$ power sources. The diodes $D_{13}$, $D_{14}$ and the resistance $R_{19}$ are connected in series between the power source $V_{CC3}$ and ground, and the base voltage $V_B$ of the transistor $T_2$ is derived from the connection between the diode $D_{14}$ and the resistance $R_{19}$. The resistances $R_{11}$, $R_{12}$, $R_{13}$ and a variable resistor $R_X$ are connected in series between the power source $V_{CC4}$ and ground, the diode $D_{11}$ is connected in the forward direction in parallel with the series connection of resistances $R_{12}$ and $R_{13}$, and the base of the transistor $T_{11}$ is connected to the connection between the resistances $R_{12}$ and $R_{13}$. Between the emitter of the transistor $T_{11}$ and ground, resistance $R_{14}$ and diode $D_{15}$ are respectively connected. The collector of the transistor $T_{11}$ is connected through resistances $R_{15}$, $R_{16}$ and $R_{17}$ to power source $V_{CC3}$. In parallel with resistance $R_{17}$, diode $D_{12}$ is connected. To the connection between resistances $R_{15}$ and $R_{16}$, the base of the transistor $T_{12}$ is connected. The collector of the transistor $T_{12}$ is directly connected to the power source $V_{CC3}$, and the emitter is grounded through resistance $R_{18}$.

In this circuit, the parameters of the various components constituting the gain control circuit are set as follows. (1) When the resistance of the variable resistor $R_X$ is at a minimum, the base voltage (control voltage) $V_A$ of the transistor $T_1$ becomes sufficiently higher than the base voltage $V_B$ of the transistor $T_2$ (for example, approximately 0.4 - 0.5 V higher). (2) When the variable resistor $R_X$ is manipulated, the base voltage $V_A$ of the transistor $T_1$ varies within a range of ±0.1 V relative to the base voltage $V_B$ of the transistor $T_2$, in a range of the greater part of the varying resistance of the variable resistor $R_X$. (3) The resistance of the resistor $R_{17}$ is comparatively large (≅ 15 KΩ), whereas that of the resistor $R_{16}$ is comparatively small (≈ 167 Ω).

Figure 4:
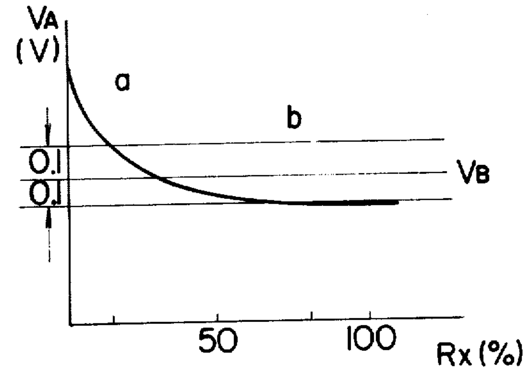
FIG. 4 is a diagram for explaining the operation of the embodiment in FIG. 3.

Referring now to FIG. 4, the operation of the embodiment will be described.

First, when the resistance of the variable resistor $R_X$ is minimum (zero), the base voltage $V_A$ of the transistor $T_1$ (the emitter voltage of the transistor $T_{12}$) is sufficiently higher than the base voltage $V_B$ of the transistor $T_2$, so that the transistor $T_2$ is in the cutoff state and no signal component appears at the output terminal OUT.

Next, in a range in which the resistance of the variable resistor $R_X$ is low, the base potential of the transistor $T_{11}$ is low. Therefore, the collector current $I_{C11}$ of the transistor $T_{11}$ is small, its greater part flows through the resistance $R_{17}$, and the diode $D_{12}$ is in the "off" state. This is because the potential difference across the resistance $R_{17}$ is small and does not reach the threshold level (forward voltage = 0.6 - 0.7 V) of the diode $D_{12}$. Accordingly, the base voltage VA of the transistor $T_1$ at this time changes abruptly, as shown at a curve portion *a* in FIG. 4, at a gradient which is substantially determined by the value of the resistor $R_{17}$. In other words, the base voltage VA changes largely by changing the resistance of the variable resistor $R_X$ only slightly.

When the resistance of the variable resistor $R_X$ becomes large, the base potential of the transistor $T_{11}$ becomes a high and also the collector current $I_{C11}$ becomes large. Under such conditions, the potential difference across the resistor $R_{17}$ is sufficiently higher than the threshold level of the diode $D_{12}$. The collector current $I_{C11}$ at this time flows through the diode $D_{12}$, and the potential difference across the resistor $R_{17}$ is clamped by the threshold level of the diode $D_{12}$. When, under this condition, the resistance of the variable resistor $R_X$ is changed, the base voltage $V_A$ of the transistor $T_1$ changes gradually, as shown at a curve portion *b* in FIG. 4, at a gradient which is substantially determined by the value of the resistor $R_{16}$.

The connection between the resistances $R_{12}$, $R_{13}$, connected in parallel with the diode $D_{11}$, is connected to the base of the transistor $T_{11}$, so that even when the resistance of the variable resistor $R_X$ reaches a minimum, the base of the transistor $T_{11}$ is biased at $R_3/R_2 + R_3 . V_{F1}$ (volts)(where $R_2$ and $R_3$ denote the resistances of the resistors $R_{12}$ and $R_{13}$, respectively, and $V_{F1}$ denotes the forward voltage of the diode $D_{11}$). Accordingly, when the resistance of the variable resistor $R_X$ is slightly increased, the base current begins to be supplied to the transistor $T_{11}$. In the characteristic in FIG. 4, therefore, the insensitive region is decreased in which, even when the resistance of the variable resistor $R_X$ is changed, the base voltage $V_A$ of the transistor $T_1$ does not change.

Although, in the embodiment, the diode $D_{12}$ is connected in parallel with the resistance $R_{17}$ in order to achieve the curved characteristic, it may be replaced with a Zener diode. Essentially, any other element having a constant voltage characteristic can be adopted insofar as it can clamp the potential difference across the resistance $R_{17}$, when connected in parallel with the resistance $R_{17}$.

It is a matter of course that the present invention is not restricted to the foregoing embodiment, but that a variety of applications and modifications are possible. For example, in order to prevent an output DC level from fluctuating, the transistors $T_1$ and $T_2$ having a differential amplification function and a differential amplifier circuit for compensation may be combined.

As is set forth above, with the gain control circuit according to the present invention, gain control can be carried out by fully exploiting the minimum to maximum resistances of the variable resistor, the fine adjustment by the manipulator is easy, and no signal appears at the output terminal when the resistance of the variable resistor is minimized. In accordance with the present invention, even when the characteristics of the constituting components are dispersive, the above-mentioned effects can be satisfactorily brought forth, and hence, it is very effective when applied to a semiconductor integrated circuit.

What is claimed is:

1. In a gain control circuit having a differential amplifier and a variable resistor coupled to an input thereof for controlling the output of said differential amplifier, said differential amplifier comprising emitter-coupled transistors, respective emitters of which are grounded through a signal source, the improvement comprising a transistor circuit, connected between said variable resistor and said input of said differential amplifier, having first and second transistors each having engaged emitter terminal, a base terminal, and a collector terminal, the base emitter terminals of said first transistor being connected to a base-emitter bias circuit including said variable resistor, the collector terminal of said first transistor being coupled to the base terminal of said second transistor, the emitter terminal of said second transistor being connected to said input of said differential amplifier and being grounded through a resistance, the collector terminal of said first transistor being connected to a collector voltage bias circuit containing a non-linear impedance, and the collector terminal of said second transistor being connected to a collector supply voltage.

2. The improvement according to claim 1, wherein said non-linear impedance comprises first and second series connected resistors coupled between the collector of said first transistor and a collector supply voltage, and a diode, connected in the forward direction with respect to said collector supply voltage, in parallel with said first resistor.

3. The improvement according to claim 2, wherein the resistance value of said first resistor is comparatively large with respect to that of signals second resistor.

4. The improvement according to claim 3, wherein the resistance value of said first resistor is more than three orders of magnitude greater than that of said second resistor.

5. The improvement according to claim 1, wherein said non-linear impedance comprises first and second series connected resistors coupled between the collector of said first transistor and said collector supply voltage, and an element which clamps the potential difference across said first resistor to a prescribed value that is substantially equal to a threshold level of said element.

6. The improvement according to claim 5, wherein said element comprises a Zener diode.

7. The improvement according to claim 5, wherein said base-emitter bias circuit comprises a pair of series connected resistors coupled in series with said variable resistor between a base supply voltage and a source of reference potential, and a diode connected across said pair of series connected resistors, the common connection of said pair of series connected resistors being connected to the base of said first transistor.

8. The improvement according to claim 7, wherein the resistance value of said first resistor is comparatively large with respect to that of said second resistor.

* * * * *